United States Patent
Lee et al.

(10) Patent No.: US 8,962,484 B2
(45) Date of Patent: Feb. 24, 2015

(54) METHOD OF FORMING PATTERN FOR SEMICONDUCTOR DEVICE

(75) Inventors: Chia Ying Lee, New Taipei (TW); Chih-Yuan Ting, Taipei (TW); Jyu-Horng Shieh, Hsin-Chu (TW); Minghsing Tsai, Chu-Pei (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 310 days.

(21) Appl. No.: 13/328,680

(22) Filed: Dec. 16, 2011

(65) Prior Publication Data
US 2013/0157462 A1  Jun. 20, 2013

(51) Int. Cl.
*H01L 21/32* (2006.01)
*H01L 21/311* (2006.01)
*H01L 21/033* (2006.01)
*H01L 21/308* (2006.01)

(52) U.S. Cl.
CPC ...... *H01L 21/31144* (2013.01); *H01L 21/0337* (2013.01); *H01L 21/3086* (2013.01); *H01L 21/32* (2013.01)
USPC ............................. 438/696; 438/702; 438/703

(58) Field of Classification Search
CPC .......................... H01L 21/027–21/0338; H01L 21/308–21/3088; H01L 21/31116; H01L 21/31138; H01L 21/31144; H01L 21/32139
USPC ........... 438/694–703, 735–744; 430/311–318
See application file for complete search history.

(56) References Cited

U.S. PATENT DOCUMENTS

| | | | |
|---|---|---|---|
| 5,328,810 A | 7/1994 | Lowrey et al. | |
| 6,610,607 B1* | 8/2003 | Armbrust et al. | 438/717 |
| 7,271,108 B2* | 9/2007 | Sadjadi | 438/717 |
| 7,361,604 B2* | 4/2008 | Chung et al. | 438/706 |
| 7,842,558 B2* | 11/2010 | Juengling | 438/135 |
| 7,928,005 B2* | 4/2011 | Brennan et al. | 438/642 |
| 8,071,278 B1* | 12/2011 | Yamamoto | 430/394 |
| 2007/0123053 A1* | 5/2007 | Kim et al. | 438/736 |
| 2007/0148984 A1 | 6/2007 | Abatchev et al. | |
| 2007/0197014 A1* | 8/2007 | Jeon et al. | 438/597 |
| 2008/0230516 A1* | 9/2008 | Cho et al. | 216/47 |
| 2009/0035902 A1 | 2/2009 | Xu et al. | |
| 2009/0181330 A1* | 7/2009 | Gabor et al. | 430/322 |

* cited by examiner

*Primary Examiner* — Steven J Fulk
*Assistant Examiner* — Eric Ward
(74) *Attorney, Agent, or Firm* — Haynes and Boone, LLP

(57) ABSTRACT

The present disclosure provides a method including providing a semiconductor substrate and forming a first layer and a second layer on the semiconductor substrate. The first layer is patterned to provide a first element, a second element, and a space interposing the first and second elements. Spacer elements are then formed on the sidewalls on the first and second elements of the first layer. Subsequently, the second layer is etched using the spacer elements and the first and second elements as a masking element.

20 Claims, 9 Drawing Sheets

METHOD OF FORMING PATTERN FOR SEMICONDUCTOR DEVICE

BACKGROUND

As technologies progress, semiconductor devices are characterized by decreasing dimension requirements over previous generation devices. However, such a decrease in dimensions is limited by the photolithography tools used in the fabrication of the devices. The minimum size of features and spaces fabricated by a photolithography tool is dependent upon the tool's resolution capabilities. Though tools have been produced to increase the resolution capabilities, such as immersion lithography tools, the increases are often not sufficient and the time to market for such tools is often slower than the development cycle for the next generation devices. Alternative methods may exist to provide for a decreased minimum pitch (e.g. sum of the feature size and the width of a space between features); however, these methods may also fail to provide adequate critical dimensions. Additionally, the methods of reducing pattern size are often inefficient for example, adding costs and time to device fabrication.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
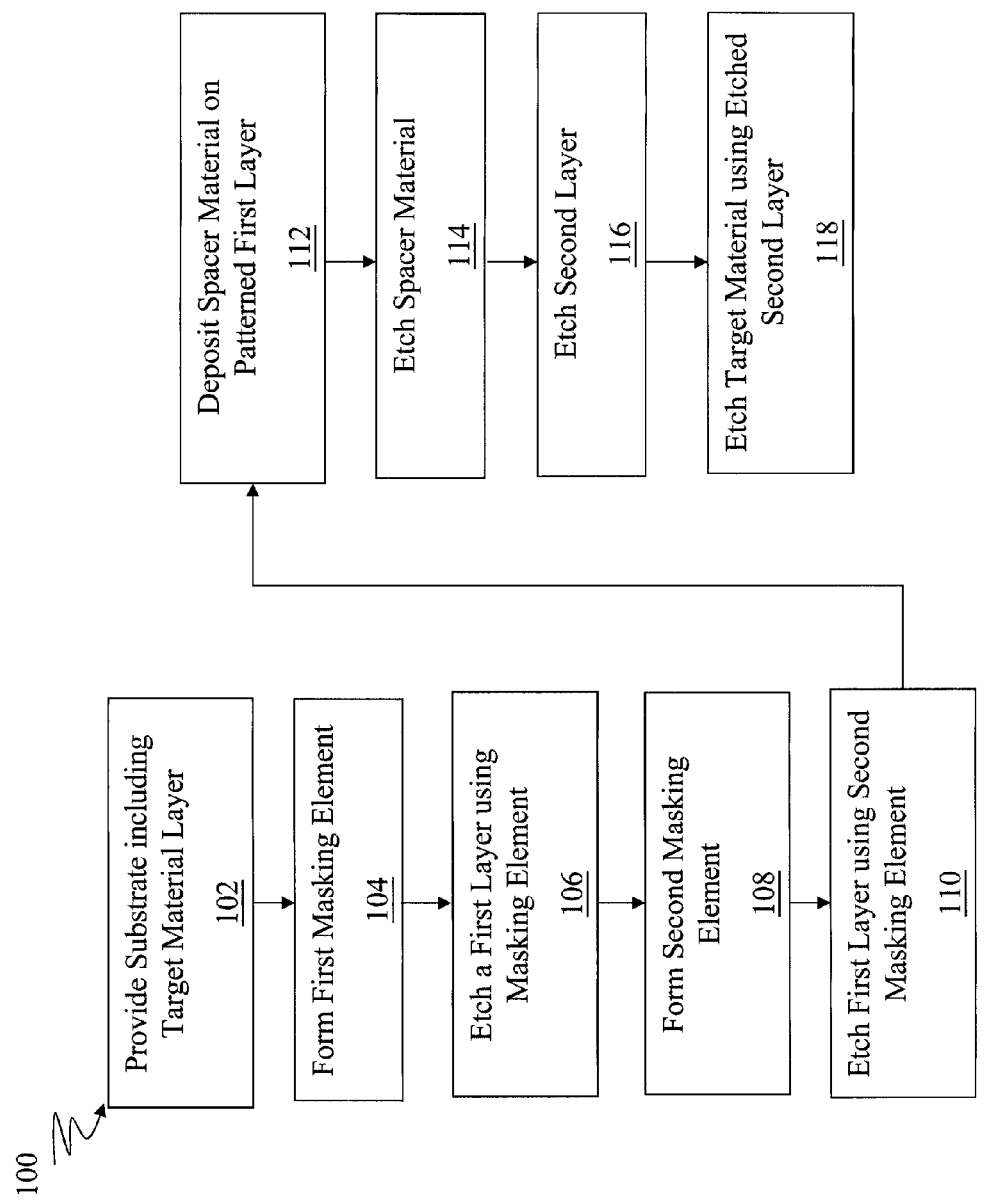
FIG. 1 is flow chart of an embodiment of a method of forming a pattern according to one or more aspects of the present disclosure.

Illustrated in FIG. 1 is a method 100 of forming a pattern on a semiconductor device. FIGS. 2-9 are cross-sectional views of an embodiment of a device 200 fabricated according to the method 100 of FIG. 1. It should be understood that FIGS. 2-9 and the device 200 are representative only and not intended to be limiting.

It is understood that the method 100 includes steps having features of a complementary metal-oxide-semiconductor (CMOS) technology process flow and thus, are only described briefly herein. Additional steps may be performed before, after, and/or during the method 100. Similarly, one may recognize other portions of a device that may benefit from the doping methods described herein.

It is also understood that parts of the semiconductor device 200 may be fabricated by complementary metal-oxide-semiconductor (CMOS) technology process flow, and thus some processes are only briefly described herein. Further, the semiconductor device 200 may include various other devices and features, such as additional transistors, bipolar junction transistors, resistors, capacitors, diodes, fuses, etc., but is simplified for a better understanding of the inventive concepts of the present disclosure. The semiconductor device 200 includes a plurality of semiconductor devices (e.g., transistors), which may be interconnected.

The method 100 begins at block 102 where a substrate is provided. In an embodiment, the substrate includes a silicon substrate (e.g., a wafer). The substrate may be silicon in a crystalline structure. In other embodiments, the substrate may include other elementary semiconductors such as germanium, or include a compound semiconductor such as, silicon carbide, gallium arsenide, indium arsenide, and indium phosphide. In an embodiment, the substrate includes a silicon-on-insulator (SOI) substrate.

The substrate may include any number of layers disposed on a bulk semiconductor layer including conductive layers and insulating layers. The substrate may further include features formed on and/or in the substrate such as, doped regions, gate structures, isolation structures, active regions, and/or other suitable features typical in semiconductor devices and/or processes.

The substrate may include a target layer, which is to be patterned using the method 100. In an embodiment, the substrate itself is the "target layer" to be patterned (e.g., etched). Exemplary target layers include silicon, phosphosilicate glass (PSG) boro-silicate glass (BSG), fluorinated silicon glass (FGS), low-k dielectric materials, undoped silicate glass (USG), tetraethylorthosilicate (TEOS) oxide, other inter-layer (or inter-metal) dielectric (ILD) material; and/or other suitable materials. In an embodiment, the target layer is deposited by a chemical vapor deposition (CVD) processes such as plasma-enhanced CVD (PECVD) process, atomic layer deposition (ALD), spin-on coating, physical vapor deposition (PVD), and/or other suitable deposition techniques.

One or more layers may overly the target layer including, for example, hard mask layers. A hard mask layer may include silicon oxide, silicon nitride, silicon oxynitride, silicon, titanium nitride, titanium, and/or other suitable hard mask material. The hard mask layer(s) may be formed by CVD, ALD, PVD, and/or other suitable deposition techniques. The hard mask layers may be used to form a pattern or transfer a pattern to the underlying target layer.

Figure 2:
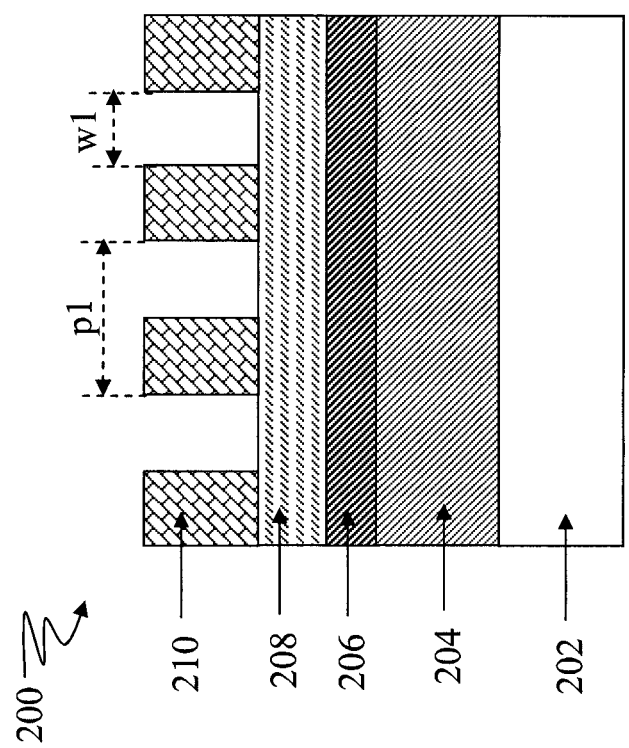
FIGS. 2-9 illustrate an embodiment of a device being fabricated according to one or more aspects of the method of FIG. 1.

Referring to the example of FIG. 2, a semiconductor device 200 is illustrated that includes a plurality of layers disposed on a substrate 202. The substrate 202 may include a semiconductor (e.g., silicon) substrate. In embodiments, the substrate 202 may include any plurality of layers of material including conductive layers and isolating layers. Additionally, the substrate 202 may include any number of features and/or device such as gate structures, interconnect structures, active regions, source/drain regions, isolation structures, p-wells, n-wells, and/or other features typical of semiconductor devices.

The semiconductor device 200 includes a target layer 204, a first layer 208, and a second layer 206 formed on the substrate 202. The target layer 204 may include silicon, phosphosilicate glass (PSG) boro-silicate glass (BSG), fluorinated silicon glass (FGS), low-k dielectric materials, undoped silicate glass (USG), tetraethylorthosilicate (TEOS) oxide, other inter-layer (or inter-metal) dielectric (ILD) materials, and/or other suitable materials. The layer 206 and/or layer 208 may include hard mask material. Exemplary hard mask materials include silicon oxide, silicon nitride, silicon oxynitride (SiON), silicon, titanium nitride (TiN), titanium (Ti), and/or other suitable hard mask materials. The layer 206 and the layer 208 may include a different composition.

The method 100 then proceeds to block 104 where a first masking element is formed on the substrate. The first masking element may be formed on the target layer. In an embodiment, several layers interpose the target layer and the first masking element (e.g., hard mask layers). The masking element may include photosensitive material (e.g., photoresist). The masking element may be formed by forming a layer of photoresist, for example, by spin-on coating followed by patterning of the photoresist using suitable photolithography methods. In an embodiment, the photolithography methods include exposing the photoresist to a pattern (using a suitable radiation source), developing the exposed photoresist, baking process(es), cleaning process(es) and/or other suitable CMOS processing methods. The masking element may provide a pattern including a plurality of elements (e.g., line elements or other features).

The term masking element as described herein may refer to any patterned layer that is used to mask or protect a portion of the substrate or layer, while other portions of the respective substrate or layer are processed (for example, etched).

Referring to the example of FIG. 2, a masking element 210 is disposed on the substrate 202. In an embodiment, the masking element 210 is photoresist. The masking element 210 includes a pattern of elements having a pitch p1. The masking element 210 pattern further includes a width w1 provided between elements (e.g., line elements) of the pattern. The pitch p1 may be between approximately 50 nanometers (nm) and approximately 150 nm. In an embodiment, the pitch p1 is approximately 100 nm. However, numerous other embodiments may be possible and within the scope of the disclosure. The width w1 may be between approximately 20 nm and approximately 100 nm. In an embodiment, the width w1 is approximately 50 nm. However, numerous other embodiments may be possible and within the scope of the disclosure. The masking element 210 may be formed using lithography processes typical of semiconductor device fabrication.

The method 100 then proceeds to block 106 where a first layer is etched using the masking element, described above with reference to block 104. The first layer may include a hard mask layer. In an embodiment, the masking element is formed directly on the first layer. The first layer may be etched using an anisotropic etch process. The etching may include dry etching (e.g., reactive ion etching, sputtering, vapor phase etching), plasma etching, and/or other suitable etching processes. The etching may provide a pattern, defined by the masking element, to the first layer. The pattern may include a plurality of elements (e.g., line elements) interposed by spaces. In an embodiment, the masking element (e.g., photoresist) is stripped from the substrate after the etching process.

Figure 3:
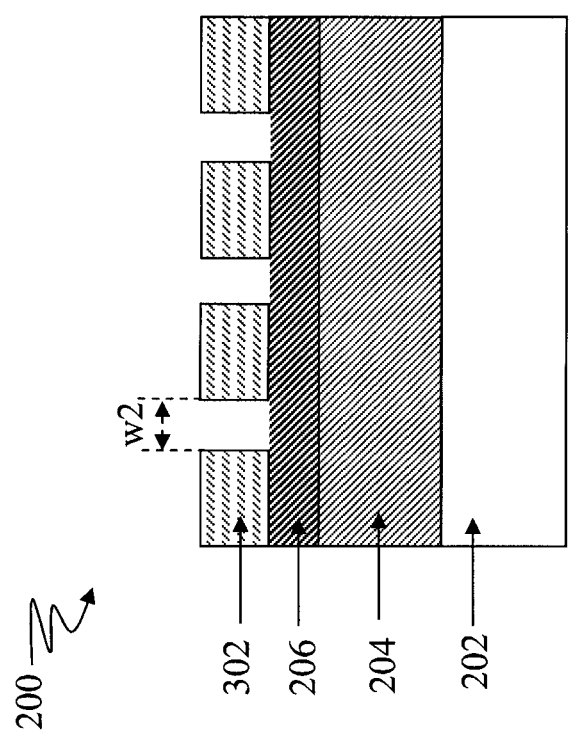

Referring to the example of FIG. 3, the first layer 208, described above with reference to FIG. 2, is etched to form patterned layer 302 as illustrated in FIG. 3. In other words, the pattern of the masking element 210 is transferred to the layer 302. The patterned layer 302 includes a plurality of elements interposed by spaces. The pattern 302 may include a width w2 between elements (e.g., space). The width w2 may be between approximately 20 nm and approximately 50 nm. In an embodiment, the width w2 is approximately 35 nm. In an embodiment, the width w2 is approximately 50 nm. However, numerous other embodiments are possible and within the scope of the present disclosure.

The method 100 then proceeds to block 108 where a second masking element is formed. The second masking element may be formed using a second photolithography process (e.g., the first photolithography process described above with reference to block 104 of the method 100).

The second masking element may be formed on the patterned first layer. In an embodiment, the second masking element is formed directly on the patterned first layer. The second masking element may also include an interface with a layer underlying the patterned first layer (e.g., a second hard mask layer). The masking element may be formed by forming a layer of photoresist, for example, by spin-on coating and patterning the photoresist using suitable photolithography methods. In an embodiment, the photolithography methods include exposing the photoresist to a pattern, developing the exposed photoresist, baking process(s), cleaning process(es) and/or other suitable CMOS processing methods. The masking element may provide a pattern including a plurality of repeating elements (e.g., line elements). The masking element of block 108 may fill the spaces included in the patterned first layer (patterned as described above with reference to block 106). The masking element may further be formed on a portion of the line elements of the patterned first layer, for example, adjacent the spaces or openings.

Figure 4:
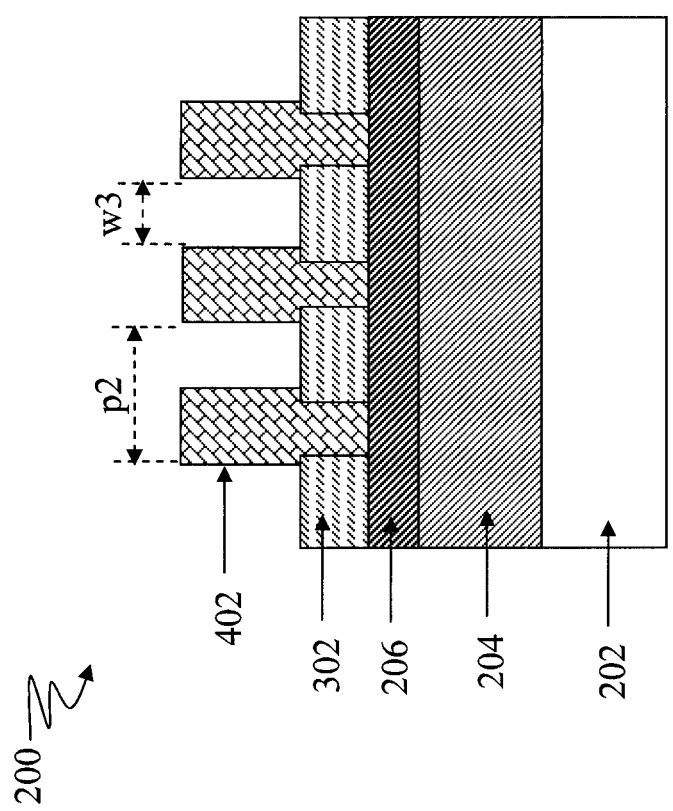

Referring to the example of FIG. 4, a masking element 402 is disposed on the substrate 202. In an embodiment, the masking element 402 is photoresist. The masking element 402 includes a pattern having a pitch p2. The masking element 402 pattern further includes a width w3 provided between elements (e.g., line elements) of the pattern. The pitch p2 may be between approximately 50 nanometers (nm) and approximately 150 nm. In an embodiment, the pitch p2 is approximately 100 nm. However, numerous other embodiments may be possible and within the scope of the disclosure. The width w3 may be between approximately 20 nm and approximately 100 nm. In an embodiment, the width w3 is approximately 50 nm. However, numerous other embodiments may be possible and within the scope of the disclosure. The masking element 402 may be formed using lithography processes typical of semiconductor device fabrication.

The method 100 then proceeds to block 110 where the first layer, also described above with reference to block 106, is etched using the second masking element. The first layer may include a hard mask layer. In an embodiment, the second masking element is formed directly on the first layer. The first layer may be etched using an anisotropic etch process. The etching may include dry etching, plasma etching, and/or other suitable etching processes. The etching provides a pattern, defined (in part) by the second masking element, to the first layer. In an embodiment, the second masking element (e.g., photoresist) is stripped from the substrate after the etching process.

The etching of block 110 provides a third pattern to the first layer, which results from the combination of the first pattern, defined by the masking element of block 104 and provided to the first layer in block 106, and the second pattern, defined by the masking element of claim 108 and provided to the first layer in block 110. The third pattern may include a plurality of elements with spaces (openings) interposing the elements (e.g., line elements). The elements of the third pattern may have a width less than that of the first and/or second pattern. The spaces (openings) of the third pattern may have a width that is less than the first and/or second pattern. Thus, the third pattern provides for a reduced dimension.

Figure 5:
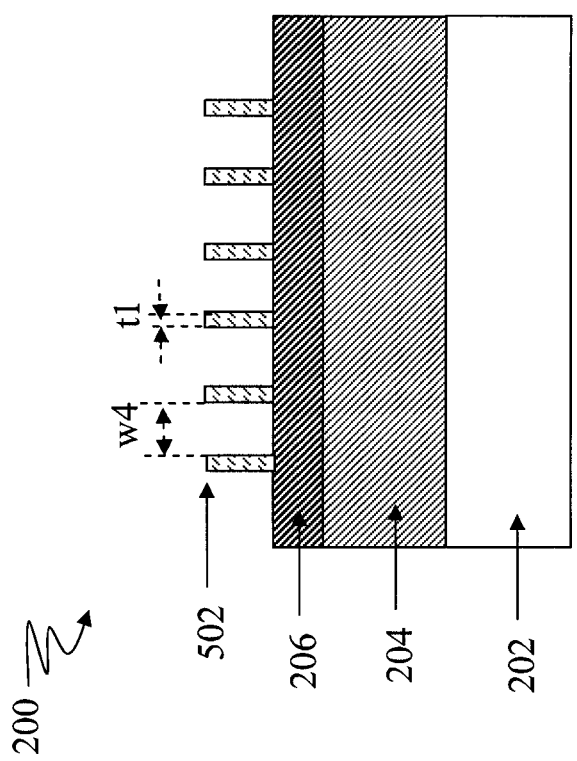

Referring to the example of FIG. 5, the first patterned layer 302, described above with reference to FIG. 3, is etched to form modified patterned layer 502 as illustrated in FIG. 5. The pattern of the masking element 402 is transferred to the layer 302. The modified patterned layer 502 may include a width w4 between elements (e.g., line elements). The width w4 may be between approximately 20 nm and approximately 50 nm. In an embodiment, the width w4 is approximately 35 nm. However, numerous other embodiments are possible and within the scope of the present disclosure. The modified pattern layer 502 includes a plurality of elements (e.g., line elements) have a thickness t1. The thickness t1 may be between approximately 20 nm and 40 nm. In an embodiment, the thickness t1 is approximately 30 nm.

The method 100 then proceeds to block 112 where a layer is formed on the patterned first layer (e.g., the layer patterned by blocks 106 and 110 of the method 100). The layer may be a conformal layer. In an embodiment, the layer is referred to a spacer layer. The layer may be a dielectric material. Exemplary materials for the layer formed in block 112 include silicon oxide, silicon nitride, titanium oxide, aluminum oxide, and/or other suitable materials. The layer may be between approximately 5 nm and 20 nm in thickness. In an embodiment, the layer is approximately 10 nm in thickness. The layer may be formed by chemical vapor deposition (CVD), physical vapor deposition (PVD), atomic layer deposition (ALD), and/or other suitable deposition processes known in the art.

Figure 6:
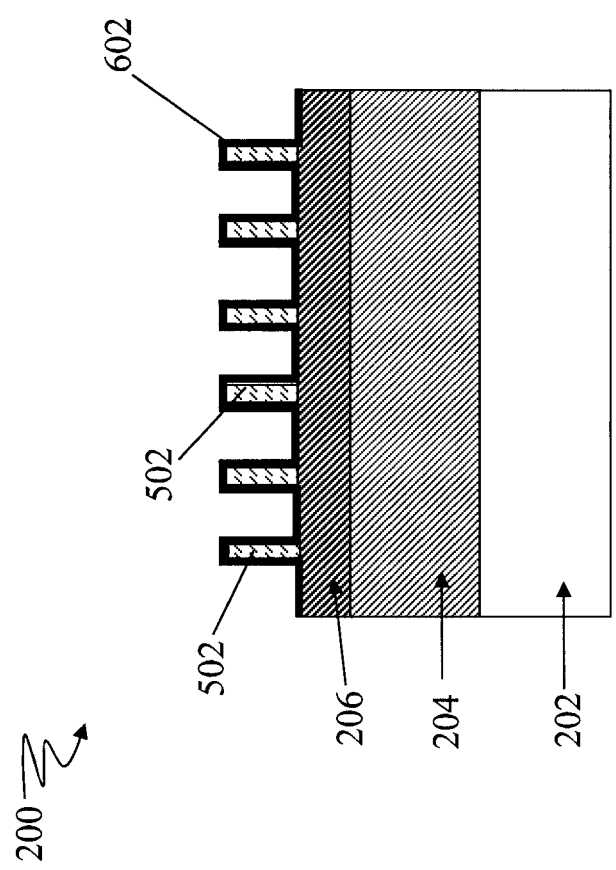

Referring to the example of FIG. 6, a conformal layer 602 is formed on the modified pattern layer 502. The conformal layer 602 may be silicon oxide, silicon nitride, titanium oxide, aluminum oxide, and/or other suitable materials. The conformal layer 602 may be formed on the ends and top of the elements of the patterned layer 502 as well as the sidewalls.

The method 100 then proceeds to block 114 where the layer (e.g., spacer layer) formed in block 112 of the method 100 is etched. The etching may include removing the spacer layer from the top and/or ends of pattern (e.g., lines) of the patterned first layer. The removal may include removing the layer from the openings of the patterned first layer (e.g., from the surface of an underlying layer). The etching may include dry etching, plasma etching, wet etching and/or other suitable processes including those that require additional photolithography processes.

Figure 7:
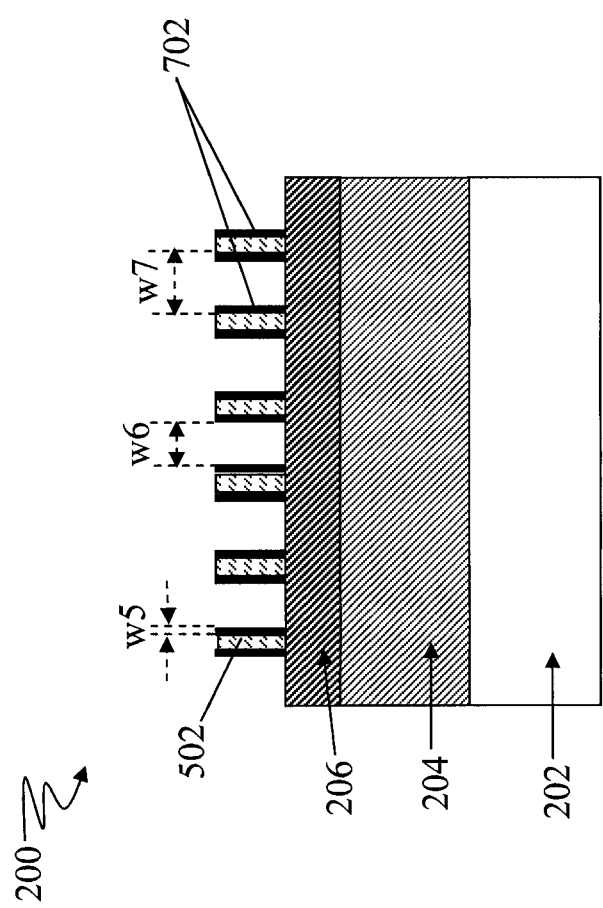

Referring to the example of FIG. 7, the conformal layer 602, described above with reference to FIG. 6, has been etched to form spacer elements 702. The spacer elements 702 are formed on the sidewalls of the elements of the modified pattern layer 502. The spacer elements 702 include a width w5. The width w5 may be between approximately 5 nm and 20 nm. In an embodiment, the width w5 is approximately 10 nm. A width w6 is provided between adjacent spacer elements 702. The width w6 may be between approximately 10 nm and approximately 30 nm. A width w7 is provided between adjacent elements of the patterned layer 502. The width w7 may be between approximately 20 nm and approximately 50 nm. In an embodiment, the width w7 is approximately 35 nm. The width w7 may be substantially similar to the width w4, described above with reference to FIG. 4. The above described dimension of w5, w6, and/or w7 are exemplary only and not intended to be limiting.

The method 100 then proceeds to block 116 where a second layer, also disposed on the substrate, is etched. The second layer may underlie the first layer. In an embodiment, the second layer includes a direct interface with the first layer, however other embodiments are possible. The second layer may include a hard mask material. Exemplary compositions for the second layer include silicon oxide, silicon nitride, silicon oxynitride, silicon, titanium nitride, titanium, and/or other suitable materials. The second layer may be formed by CVD, PVD, ALD, and/or the suitable deposition methods.

The second layer may be etched using a masking element defined by the patterned first layer and the spacer material (i.e., the masking element for the etch of block 116 includes the patterned first layer and spacer element). The etching process may be an anisotropic process. The etching may be provided by plasma etching, dry etching, and/or other suitable processes. The spacer elements and/or modified first layer may be removed from the substrate after the second layer is etched. In an embodiment, the spacer elements and/or the modified first layer is removed in whole or in part concurrently with the etching of the second layer.

Figure 8:
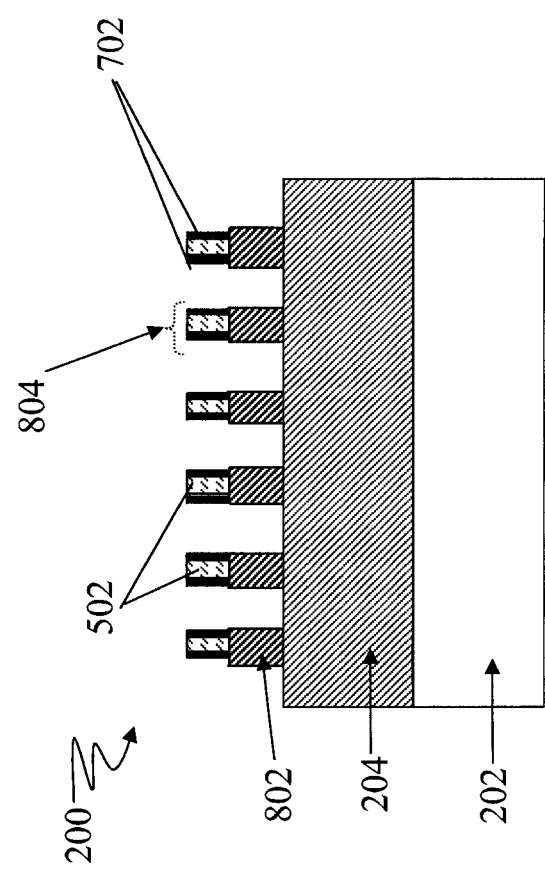

Referring to the example of FIG. 8, the spacer elements 702 and the elements of the modified first layer 502 together form masking element 804. The masking element 804 is used to define a pattern in second layer 206. The patterned second layer is illustrated as patterned second layer 802. The patterned second layer 802 includes the portions of the second layer 206 underlying the masking element 804.

The method 100 then proceeds to block 118 where a target layer is etched using the patterned second layer. The target layer may be etched using the patterned second layer as a masking element. The target layer may be etched using wet etch, dry etch, plasma etch, and/or other suitable etching process. The patterned target layer may be used to form features of the semiconductor device such as, for example, shallow trench isolation (STI) features, contact features, interconnect features such as vias or trenches, and/or other suitable features. Thus, the method 100 may be performed during the front-end of the line (FEOL) processes and/or back-end of the line (BEOL) processes of a semiconductor fabrication process (e.g., CMOS).

Figure 9:
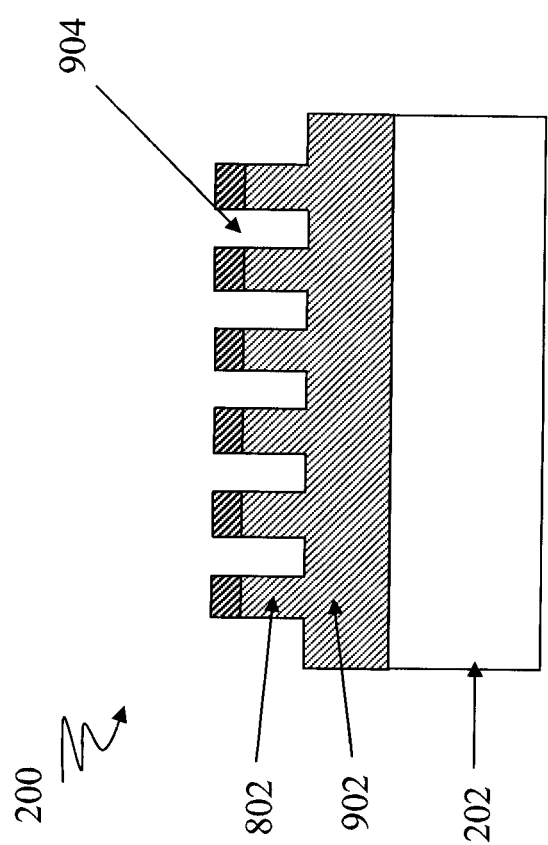

Referring to the example of FIG. 9, the target layer 204, described above with reference to FIG. 2, is etched using the patterned layer 802 as a masking element to form patterned target layer 902. The patterned layer 902 includes trenches 904. The trenches 904 may have a width substantially similar to the width w6, described above with reference to FIG. 7. In an embodiment, the width of the thrench 904 is approximately 15 nm. The width of the trenches 804 may define a critical dimension (CD). The patterned layer 902 may provide shallow trench isolation features, contact features, vias, trenches, holes, lines, and/or other semiconductor features.

The method 100 may continue to other processes, including the removal of the second layer overlying the target layer. The second layer may be removed by suitable stripping processes, chemical mechanical polish (CMP) processes, and/or other suitable processes.

In an embodiment of the method 100, a distinct target layer is omitted. For example, the patterned second layer (e.g., patterned layer 802) is used to etch the semiconductor substrate (e.g., a silicon substrate 202). The etching of the substrate may etch an epitaxial or active region of the substrate. In an embodiment, the etching of the substrate provides for shallow trench isolation features.

Embodiments of exemplary compositions are described below, however, it should be noted that these are exemplary only and not intended to be limiting. In an embodiment, the first layer (e.g., 208) is silicon nitride, titanium nitride, or silicon; the second layer (e.g., 206) is silicon oxide or silicon oxynitride; and the conformal layer (e.g., 602) is silicon oxide. In another embodiment, the first layer (e.g., 208) is silicon oxide; the second layer (e.g., 206) is titanium nitride or silicon; and the conformal layer (e.g., 602) is titanium oxide or aluminum oxide. In another embodiment, the first layer (e.g., 208) is silicon oxide, titanium nitride, or silicon; the second layer (e.g., 206) is silicon nitride; and the conformal layer (e.g., 602) is silicon nitride.

In summary, the methods and devices disclosed herein provide a method of forming a device having features of a reduced pitch or geometry. In doing so, embodiments of the present disclosure offers several advantages over prior art devices. Advantages of the present disclosure may include providing CD tuning capability and control and shrinking of the CD dimension.

Thus, provided in a method which provides for a lithography, etch, lithograph, etch (LELE) process to form a patterned layer (e.g., hard mask layer). The LELE process is followed by deposition of a conformal film, which is etched to form spacer elements on the sidewalls of elements of the patterned layer. The elements of the patterned layer and the spacer elements are then used as a masking element to define a pattern on an underlying layer. In embodiments, the underlying layer may then be used to pattern a target layer (e.g., separately deposited layer or substrate). The patterned target layer may provide or define line or hole features of a semiconductor device.

In an embodiment, a method of semiconductor fabrication is described that includes providing a substrate and performing a first photolithography process, a first etch process, a second photolithography process and a second etching process to form a plurality of features in a first layer disposed on the substrate. Sidewall spacer elements are then formed on each of the plurality of features. The plurality of features and the sidewall spacer elements are then used as a masking element during an anisotropic etching process of an underlying layer.

In an embodiment, a method includes providing a semiconductor substrate and forming a first layer and a second layer on the semiconductor substrate. The first is patterned to provide a first line element, a second line element, and a space interposing the first and second line elements. A spacer element is formed on sidewalls on the first and second line elements of the first layer. Subsequently, an etching process is performed the second layer using the spacer elements and the first and second line elements as a masking element.

In still another embodiment, a method includes providing a substrate having a first layer and a hard mask layer formed on the first layer and etching a first pattern in the hard mask layer. The first pattern includes a plurality of elements having a first width. After etching the first pattern, a second etching process is performed on the hard mask layer. The second etching process modifies the first pattern to provide a second pattern having a plurality of elements of a second width. The second width is less than the first width. A conformal layer is formed on the second pattern in the hard mask layer, and then etched to form a spacer element a sidewall of each of the plurality of elements having the second width. The spacer elements and the plurality elements having the second width are used as masking elements (e.g., protecting regions underlying the spacer elements and plurality of elements) while etching the first layer.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they make various changes, substitutions and alterations herein without departing from the spirit and scope of the present disclosure.

What is claimed is:

1. A method, comprising:
   providing a semiconductor substrate;
   forming a first layer and a second layer on the semiconductor substrate;
   patterning the first layer, wherein patterning includes:
      forming a first patterned photoresist layer on the first layer;
      etching the first layer using the first patterned photoresist layer to provide a first element, a second element, and a space interposing the first and second elements;
      forming a second patterned photoresist layer directly on the first element, second element, and the space interposing the first and second elements;
      using the second patterned photoresist layer to etch the first and second elements such that the first and second elements each have a decreased width;
   after patterning the first layer, forming spacer elements on sidewalls on the first and second elements of the first layer having the decreased widths;
   etching the second layer using the spacer elements and the first and second elements having the decreased widths as a masking element;
   removing the patterned first layer and the spacer elements from the semiconductor substrate; and
   after removing the patterned first layer and spacer elements, using the etched second layer as a masking element in a subsequent etching process.

2. The method of claim 1, wherein the forming spacer elements includes:
   forming a conformal layer on the patterned first layer;
   etching the conformal layer to form the spacer elements.

3. The method of claim 1, wherein the first layer includes a hard mask material.

4. The method of claim 1, wherein the first layer includes a composition selected from the group consisting of silicon oxide, silicon nitride, silicon oxynitride, silicon, titanium nitride, titanium, and combinations thereof.

5. The method of claim 1, wherein the second layer is a hard mask layer.

6. The method of claim 1, wherein the subsequent etching process includes using the etched second layer as a masking element in etching the semiconductor substrate.

7. The method of claim 1, wherein the subsequent etching process includes using the etched second layer as a masking element in etching a target layer disposed on the semiconductor substrate.

8. The method of claim 7, wherein the target layer includes a composition selected from the group consisting of silicon, phosphosilicate glass (PSG) boro-silicate glass (BSG), fluorinated silicon glass (FGS), low-k dielectric materials, undoped silicate glass (USG), tetraethylorthosilicate (TEOS) oxide, and combinations thereof.

9. The method of claim 1, wherein the removing the patterned first layer and the spacer elements from the semiconductor substrate is performed concurrently with etching the second layer.

10. A method, comprising:
   providing a substrate having a first layer and a hard mask layer formed on the first layer;
   etching a first pattern in the hard mask layer, wherein the first pattern includes a plurality of elements having a first width and having a space between each of the plurality of elements;

after etching the first pattern, forming a photoresist layer on the etched hard mask layer including on the plurality of elements and in the space between each of the plurality of elements;

patterning the photoresist layer to create a photoresist masking element;

performing a second etching process on the hard mask layer using the photoresist masking element, wherein the second etching process modifies the first pattern of the hard mask layer to provide a second pattern of the hard mask layer having a plurality of elements of a second width, the second width being less than the first width;

forming a conformal layer on the second pattern formed in the hard mask layer;

etching the conformal layer to form a spacer element on a sidewall of each of the plurality of elements having the second width; and using the spacer elements and the plurality elements having the second width as masking elements while etching the first layer;

thereafter, removing the spacer elements and the plurality of elements having the second width; and after the removing, using the etched first layer to pattern an underlying layer.

11. The method of claim 10, wherein the spacer elements have a width less than the second width.

12. The method of claim 10, wherein the first layer includes a hard mask material different than composition of the hard mask layer.

13. The method of claim 10, wherein the conformal layer includes at least one of silicon oxide, silicon nitride, titanium oxide, and aluminum oxide.

14. The method of claim 10, wherein the second pattern includes the plurality of elements of the second width, wherein the plurality of elements include substantially similar dimensioned elements and a space interposes each of the elements.

15. The method of claim 10, wherein the forming the photoresist layer includes forming the photoresist layer directly on the first layer.

16. A method of semiconductor fabrication, comprising:

providing a substrate having a first layer disposed thereon;

performing a first photolithography process and a first etch process to form a plurality of features in the first layer, wherein each feature has a first width and space interposes each of the plurality of features;

forming a photoresist layer directly on the plurality of features and within the space interposing each of the plurality of features;

performing a second photolithography process by patterning the photoresist layer;

performing a second etching process using the patterned photoresist layer to etch the plurality of features in the first layer to form a plurality of features in the first layer having a second width disposed on the substrate;

form a sidewall spacer element on each of the plurality of features having the second width;

using the plurality of features having the second width and the sidewall spacer elements as a masking element during an anisotropic etching process of a second hard mask layer;

removing the plurality of features having the second width and the sidewall spacer elements; and after the removing, using the etched second hard mask layer to pattern an underlying layer.

17. The method of claim 16, wherein the etching of the underlying layer provides a pattern associated with shallow trench isolation (STI) features.

18. The method of claim 16, wherein the etching of the underlying layer provides a pattern associated with contact features.

19. The method of claim 16, wherein the etching of the underlying layer provides a pattern associated with interconnect features.

20. The method of claim 19, wherein the interconnect features are at least one of a trench and a via.

* * * * *